United States Patent
Kwak et al.

(10) Patent No.: US 6,437,725 B1
(45) Date of Patent: Aug. 20, 2002

(54) PARALLEL TO SERIAL CONVERTER

(75) Inventors: Myoung-bo Kwak, Seoul; Jae-young Moon, Suwon, both of (KR)

(73) Assignee: Samsung Electronics Co., Ltd., Kyungki-Do (KR)

(*) Notice: Subject to any disclaimer, the term of this patent is extended or adjusted under 35 U.S.C. 154(b) by 0 days.

(21) Appl. No.: 09/994,955

(22) Filed: Nov. 27, 2001

Related U.S. Application Data

(60) Provisional application No. 60/276,268, filed on Mar. 15, 2001.

(51) Int. Cl.[7] .................................................. H03M 1/36
(52) U.S. Cl. ........................ 341/159; 341/100; 341/101
(58) Field of Search ................... 341/159, 100, 341/101, 102, 160, 161; 375/354, 371, 355

(56) References Cited

U.S. PATENT DOCUMENTS

| | | | | |
|---|---|---|---|---|
| 5,526,361 A | * | 6/1996 | Hedberg | 370/105.3 |
| 5,587,709 A | * | 12/1996 | Jeong | 341/100 |
| 5,714,904 A | * | 2/1998 | Jeong | 327/407 |
| 6,107,946 A | * | 8/2000 | Jeong | 341/101 |

* cited by examiner

Primary Examiner—Brian Young
Assistant Examiner—John B Nguyen
(74) Attorney, Agent, or Firm—F. Chau & Associates, LLP

(57) ABSTRACT

A circuit for serializing parallel data of n bits, comprising a first register for storing m bits of the parallel data, M being less than N, the first register being clocked by a first clock, at least one second register other than the first register for storing at least N-M bits of the parallel data, the at least one second register being clocked by at least one second clock which is different in phase from the first clock, at least one third register for storing at least the nth and (n−1)th bits of parallel data output from the at least one second register, the third register being clocked by at least one third clock which is different in phase from the first and the second clocks, and logic gates for receiving as inputs the n bits of parallel data output from the first register and output from one or both of the at least one second register and the third register to form N serial data.

19 Claims, 6 Drawing Sheets

PARALLEL TO SERIAL CONVERTER

CROSS REFERENCE

This application claims priority to U.S. Provisional application serial. No. 60/276,268, filed on Mar. 15, 2001.

BACKGROUND OF THE INVENTION

1. Technical Field

The present invention is directed to a device and a method for converting parallel data to serial data; in particular, a device and a method for converting n-bit parallel data to serial data using n-subfrequency clocks.

2. Discussion of Related Art

In high speed data links where a large amount of data is to be transmitted and received at separate data ports or remote locations, it is customary to convert the data from parallel to serial format by a parallel to serial converter for transmission over a high bandwidth channel such as fiber optics. The transmitted data is received at the other end of the fiber channel in serial format. The received data is converted back to parallel data by a serial to parallel converter for processing at the receiving end. The fiber channel is capable of transferring data at the rate of tens to hundreds of gigabits per second. The limitation of the rate of transfer is often the limited speed of operation of the parallel to serial converter.

A conventional parallel to serial converter is shown in FIG. 1. The parallel to serial converter 100 converts a ten bit parallel data to output as serial data. (As shown, the ten bit parallel data is actually eight bits wide with a '1' bit and a '0' bit boundary.) Ten NAND gates 110 corresponding to the ten data bits of parallel data are output through OR gate 130. Ten subfrequency clocks $\phi 0$ to $\phi 9$ are connected to NAND gates 110 to multiplex the ten bits of input data to output the data one at a time through NAND gates 110. The ten subfrequency clocks are derivatives of the system clock, each being equally spaced by a delay of duration about T/10, wherein T is the period of the system clock. Only two of the ten subfrequency clocks are both at logic '1' for a duration of T/10. With the subfrequency clocks conntected to the NAND gates 110 as shown in FIG. 1, the ten bit input data is enabled to pass the NAND gates in order. Ten D flip flop latches 121 are clocked by system CLOCK 1 for holding the 10 BIT data. If the parallel to serial converter of FIG. 1 did not include a second set of flip flop latches 125, there would be insufficient setup time and hold time to allow the proper clocking and conversion of parallel data to serial data. The setup time refers to an interval between a rising transition edge on any of data 0 to 7 and a rising transition edge on a clock for clocking the data into a holding register. The hold time refers to an interval between a falling transition edge on any of data 0 to 7 and a falling transition edge of a corresponding clocking clock signal. In the conventional parallel to serial converter of FIG. 1, the second set of latches 125 receives the second half of data 0 to 7 upon receipt of a second clock signal CLOCK 2, which transitions to clock data 4 to 7 into latch 125 at about the half cycle of CLOCK 1. With the second set of latches 125, the latter half of the 10-bit data is held for an additional T/2 interval. This allows a new set of 10-bit data to be loaded onto latches 121 after the transition of CLOCK 2.

FIG. 2 shows the timing relationshp of data 0–9 being clocked into latches 121 with the low to high transition of CLOCK 1 and data 5–9 being clocked into latches 125 with the low to high transition of CLOCK 2 at about half cycle of clocking period of CLOCK 1. With the second set of latches 125, extra setup time and hold time can be provided. The parallel to serial converter shown in FIG. 1 is further described in U.S. Pat. No. 5,714,904, the disclosure of which is incorporated-by-reference herein. With extra setup and hold time, a parallel to serial converter can operate at higher data rates without error due to insufficient setup and hold times.

Accordingly, a need exists for a parallel to serial converter for converting parallel data to serial data and provide extra setup and hold times and to facilitate reliable operation at high speed.

SUMMARY OF THE INVENTION

According to an aspect of the present invention, a circuit is provided for serializing parallel data of N bits, which comprises a first register for storing M bits of the parallel data, M being less than N, the first register being clocked by a first clock; at least one second register other than the first register for storing at least N-M bits of the parallel data, the at least one second register being clocked by at least one second clock which is different in phase from the first clock; at least one third register for storing at least the nth and (n−1)th bits of parallel data output from the at least one second register, the third register being clocked by at least one third clock which is different in phase from the first and the second clocks; and logic gates for receiving as inputs the N bits of parallel data output from the first register and output from one or both of the at least one second register and the third register to form N serial data.

The circuit preferably further includes a plurality of n-phased clocks, each having a different phase from the other for coupling to the inputs of the logic gates, wherein the logic gates include N gates corresponding to the N bits of data, wherein the nth bit data is input with the nth phased and ((N/2)+nth+1) phased clocks to the nth logic gate.

Preferably, the duration of time between the first clock and the second clock is substantially one third the period of a clock frame in which each of the n-phased clocks has transitioned once, wherein each of the n-phased clocks transition once within every repeated clock frame, and the first, second, and third clocks transition once within a register clock frame, and the nth bit data is output as serial data after the transition of the third clock in the register clock frame but before the end of the next register clock frame.

According to another embodiment of the invention, the at least one second register comprises two registers and the at least one second clock comprises two clocks having low to high transitions at different times within a clock frame. Alternatively, the at least one-third register comprises two registers clocked by the at least one third clock which comprises two clocks having transitions at different times.

According to a second aspect of the present invention, a circuit for serializing parallel data of N bits is provided, comprising a first register for storing M bits of the parallel data, M being less than N, the first register being clocked by a first clock; a second register for storing P bits of the parallel data, the second register being clocked by a second clock which is different from the first clock; a third register for storing Q bits of the parallel data, wherein M+P+Q=N, the third register being clocked by a third clock; and a fourth register for storing data output from the third register, the forth register being clocked by a forth clock which is different from the first, second, and third clocks; and logic gates for receiving as inputs the N bits of parallel data output from the first, second, and forth registers to form N serial data, wherein the third clock is the same as the first clock.

A method for serializing parallel data of N bits is also provided, comprising the steps of storing M bits of the parallel data in a first register, M being less than N, the first register being clocked by a first clock; storing P bits of the parallel data in a second register, the second register being clocked by a second clock which is different from the first clock; storing Q bits of the parallel data in a third register, wherein M+P+Q=N, the third register being clocked by a third clock; and storing data output from the third register in a fourth register, the fourth register being clocked by a fourth clock which is different from the first, second, and third clocks; and receiving as inputs at logic gates the N bits of parallel data output from the first, second, and forth registers to form N serial data.

An alternative method for serializing parallel data of N bits is also provided, comprising storing M bits of the parallel data in a first register, M being less than N, the first register being clocked by a first clock; storing at least N-M bits of the parallel data in at least one second register other than the first register, the at least one register being clocked by at least one second clock which is different from the first clock; storing at least the nth and (N−1)th bits of parallel data output from the at least one second register in at least one third register, the third register being clocked by at least one third clock which is different from the first and the second clocks; and receiving as inputs at logic gates the N bits of parallel data output from the first register and output from one or both of the at least one and the third registers to form N serial data.

BRIEF DESCRIPTION OF THE DRAWINGS

Further objects, features and advantages of the invention will become apparent upon consideration of the following detailed description in conjunction with the drawings, in which.

DETAILED DESCRIPTION OF PREFERRED EMBODIMENTS

In the following description and drawings, well-known element structures, circuit blocks, and architectural functions will not be described in detail. And, for the most part, details concerning timing considerations will be omitted in as much as such details are not necessary to obtain a complete understanding of the present invention and are within the skills of persons of ordinary skill in the relevant art. The present invention will now be described more in detail hereinafter with reference to the accompanying drawings.

Figure 1:
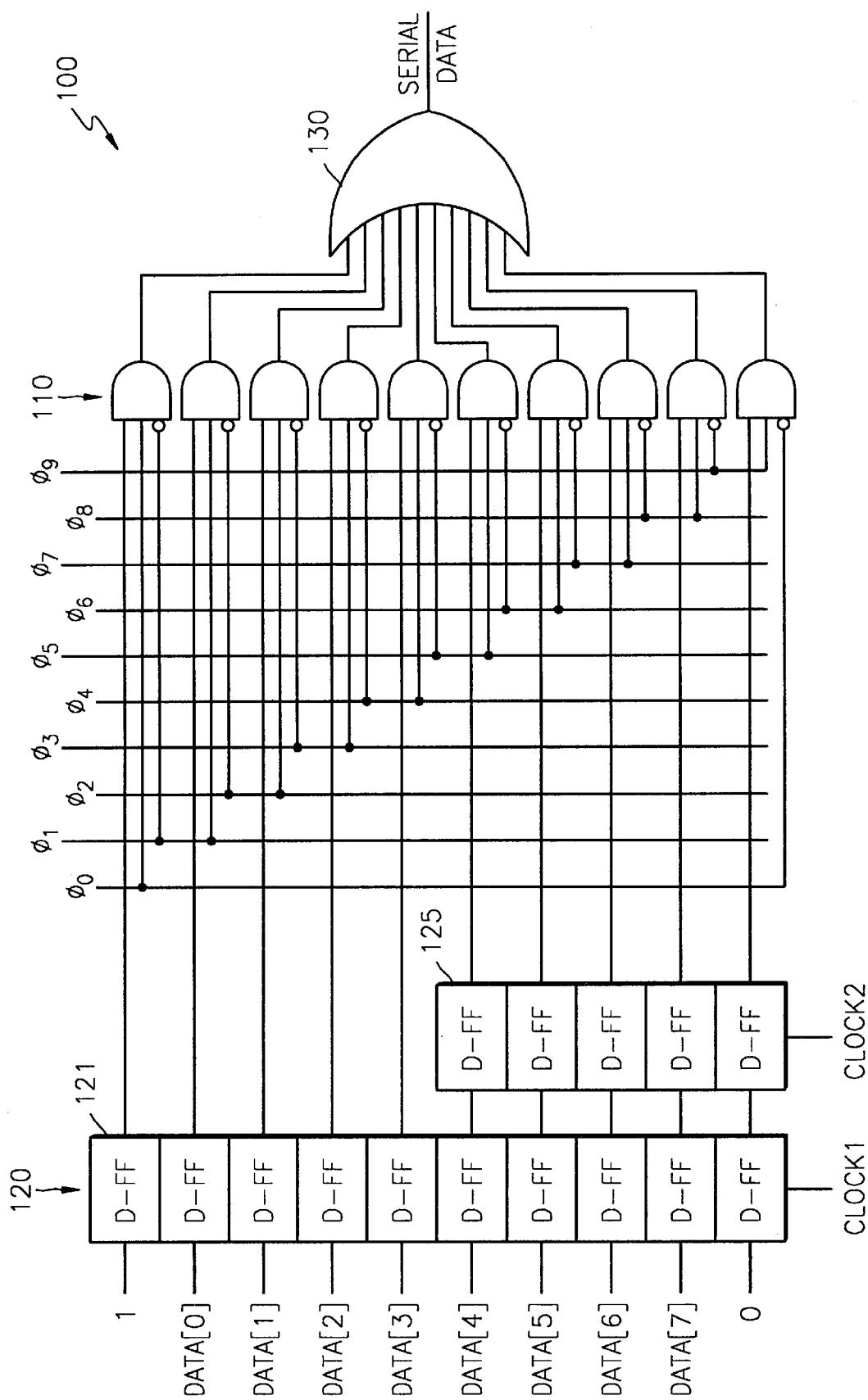
FIG. 1 shows a block diagram of a conventional parallel to serial converter;.
Figure 2:
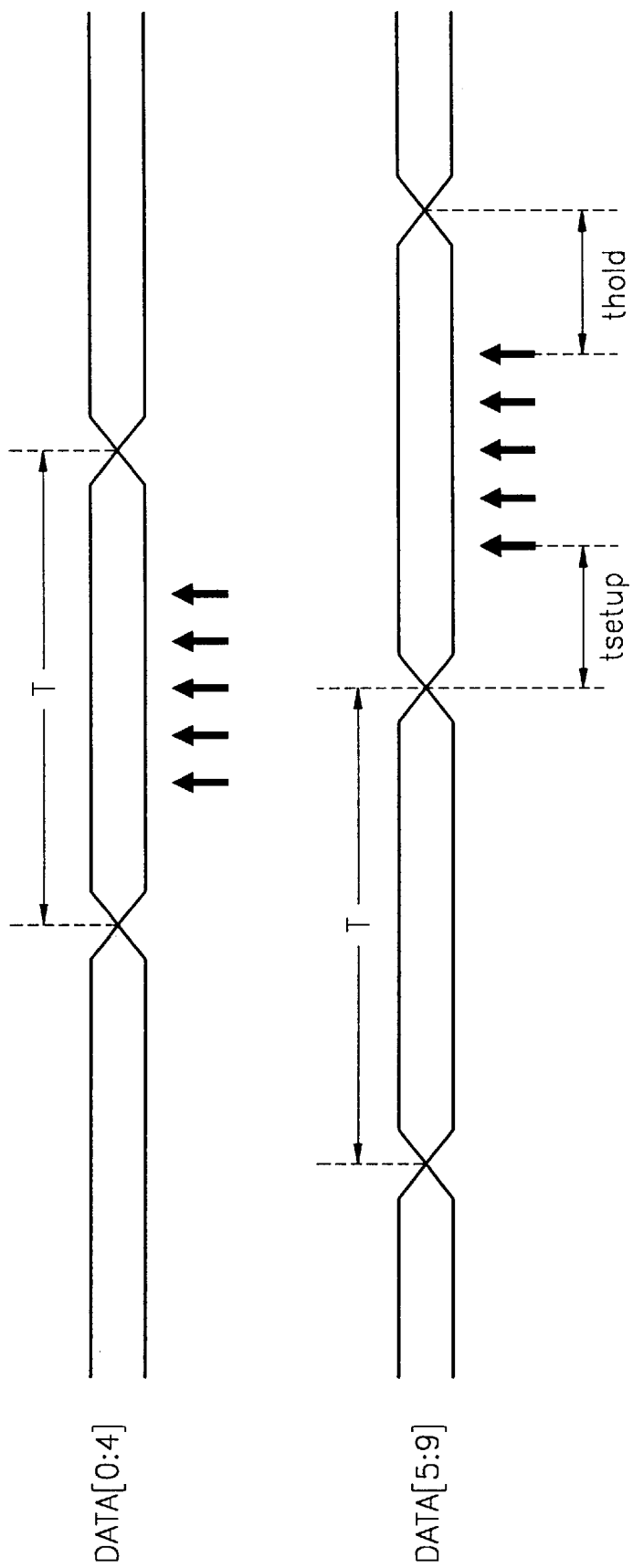
FIG. 2 shows a timing diagram of data being clocked into first and second latches of FIG. 1.
Figure 3:
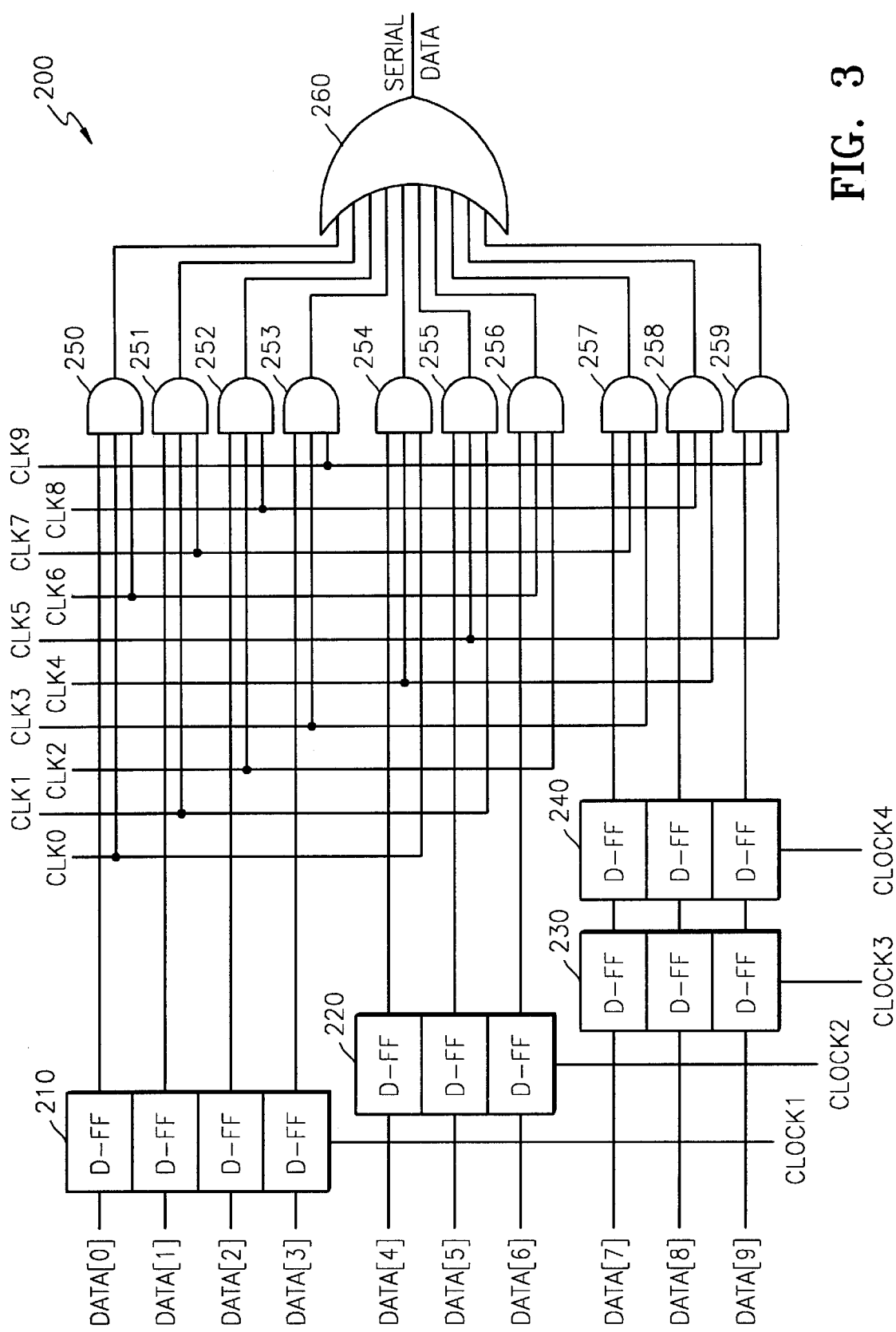
FIG. 3 shows a parallel to serial converter according an embodiment of the present invention.

Referring to FIG. 3, which shows a parallel to serial converter 200 according to an embodiment of the present invention. An N-bit parallel data, DATA (0,N−1) is input to a corresponding plurality of a series of registers 210, 220, and 230. Each of the series of registers 210, 220 and 230 is to receive about ⅓ of the parallel data input. N can be any natural number but for purposes of illustration, it is chosen to be ten. Thus, the series of registers 210 receive the first four bits of data N, DATA (0, 3). The registers 220 receive the second ⅓ of the 10-bit data, DATA (4, 6), and registers 230 receive the last ⅓ of the 10-bit data, DATA (7, 9). Each of the series of registers 210, 220, and 230 is preferably a plurality of D-type flip flops. Registers 210 is clocked by CLOCK 1. Register 220 is clocked by CLOCK 2. Registers 230 is clocked by CLOCK 3. According to the present embodiment, each of CLOCK 1, CLOCK 2, AND CLOCK 3 is of the same frequency as the system clock and therefore each has the same period T. However, each of CLOCK 1, CLOCK 2, AND CLOCK 3 has a different phase from each other. An additional series of registers 240 receive the output of registers 230. Registers 240 is clocked by CLOCK 4. CLOCK 4 also has a period of T and preferably has a phase that is different than any of CLOCK 1, CLOCK 2, and CLOCK 3. The parallel to serial converter 200 includes N three-input AND gates, each corresponding to a respective data input DATA (0,N−1). In this case, 10 AND gates 250 to 259 are provided to receive corresponding DATA (0,9) through registers 210, 220 and 240. Each of the three-input AND gates 250 to 259 is output to an N-input OR gate 260. The output of OR gate 260 is the converted serial data. One of the three inputs in each of the three input AND gates 250 to 259 receives from registers 210, 220, and 240 the corresponding input data DATA (0,9). In this embodiment, AND gate 250 is connected to the output of the first of the series of registers 210 to receive DATA 0. The three-input AND gate 251 connects to the output of the second of the series of registers 210 to receive DATA(1), and in like manner, three input AND gate 259 receives the last of the series of registers 240 to receive corresponding DATA (9). The other two inputs of each of three input AND gates 250 to 259 are connected to two of ten subfrequency clocks CLK 0 to CLK 9. The two subfrequency clock inputs at each of the three input AND gates 250 to 259 are selected to multiplex the DATA (0,9) to output at OR gate 260. That is, the subfrequency clocks are connected such that only one of three input AND gates 250 to 259 is enabled at one particular time and in bit order.

Figure 4:
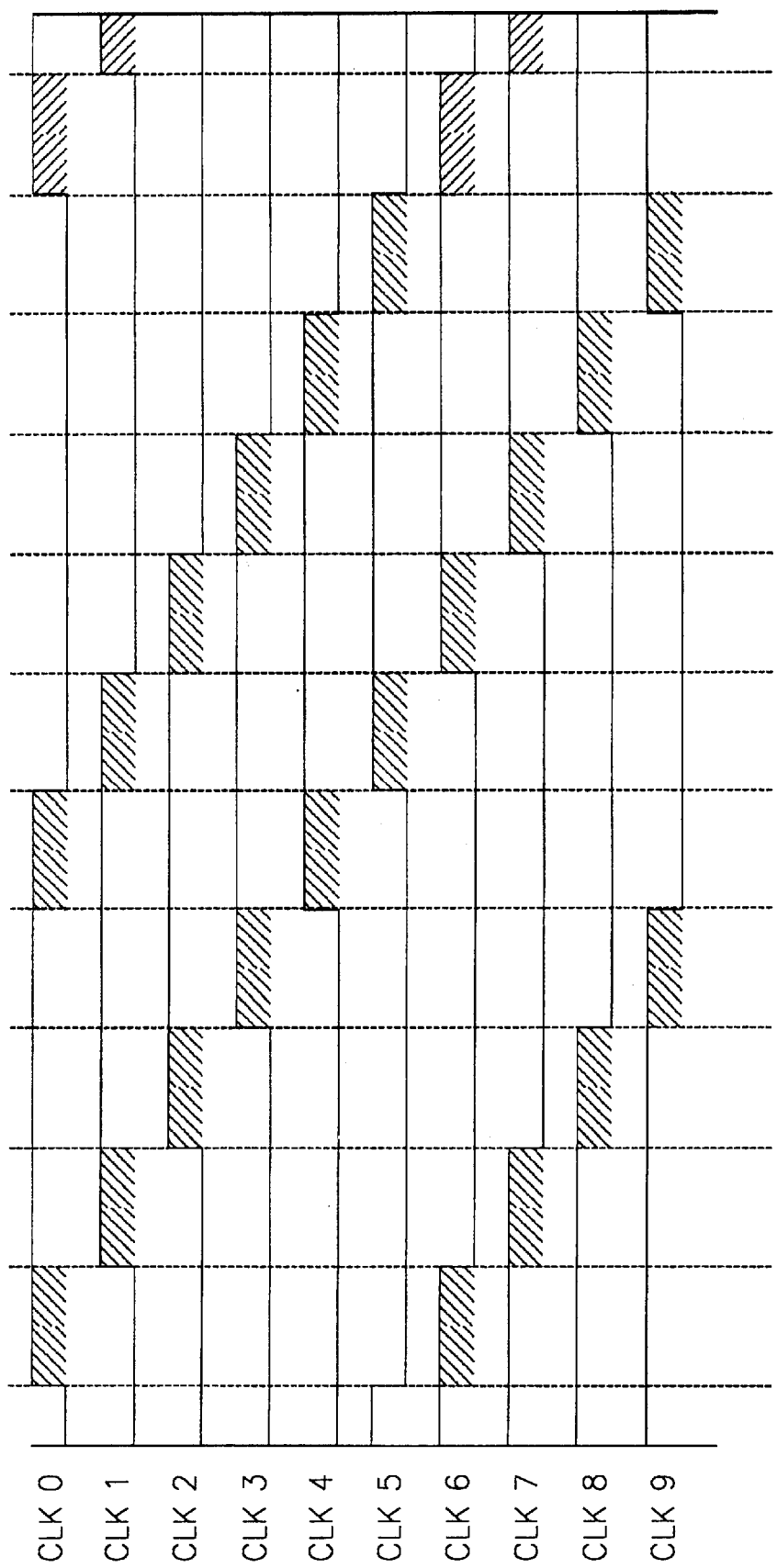
FIG. 4 is a timing diagram illustrating the timing relationship of the subfrequency clocks.

FIG. 4 shows the timing relationship of the subfrequency clocks. Each of the subfrequency clocks CLK 0 to CLK 9 has a period T and is essentially the same clock with a phase difference of duration D, with D preferably being T/N duration. According to this embodiment, phase separation between CLK 0 and CLK 1 would be of a duration of T/10. The n-phased clock is 180 degrees out-of-phase with (N/2+nth) phased clock. That is, CLK 0 has 180 degrees phase difference from CLK 5, and CLK 1 with CLK 6 and so on. Each of the n-phased subfrequency clocks transition once within every repeated clock frame, and the first, second, third, and fourth clocks CLOCK 1, CLOCK 2, CLOCK 3, and CLOCK 4, each transition once within a register clock frame. The nth bit data is output as serial data after the transition of the CLOCK 4 in the register clock frame but before the end of the next register clock frame.

Each of the three input AND gates 250 to 259 receives at two of its three inputs a combination of two subfrequency clocks for selectively enabling only one of the N three-input AND gates, thereby multiplexing DATA (0,N−1) for serial output. According to the present illustrative embodiment, the two subfrequency clocks to be combined can be expressed as the nth phased clock and the (N/2)+nth+1 phased clock. They are connected to the corresponding AND gate. Thus, referring again to FIG. 3, the three input AND gate 250 corresponding to n=0 is connected to the zero phase clock (CLK 0) and (10/2++1) or the $6^{th}$ phase clock (CLK 6). Three input AND gate 151 is connected to CLK 1 (n=1) and CLK 7 (5+1+1). In like manner, three input AND gate 259 is connected to CLK 9 and CLK 5. With the subfrequency clocks as connected to three input AND gates 250 to 259, each of the three input AND gates 250 to 259 is enabled immediately following the low to high transition of the first subfrequency clock for a duration of T/N. For example, three input AND gate 250 is enabled when both CLK 0 and CLK 6 are at high, which occurs immediately upon the transition from low to high of CLK 0 for duration of T/N, after which time CLK 6 transitions from high to low, disabling three input AND gate 250. It can be seen that during this interval wherein three input AND gate 250 is enabled, all of the other three input AND gates 251 to 259 are disabled with at least one of the two inputted subfrequency clocks being at low. And, as can be seen in the timing diagram of FIG. 4, each of the three input AND gates 250 to 259 is enabled for a duration of T/N in turn, one after another.

Figure 5:
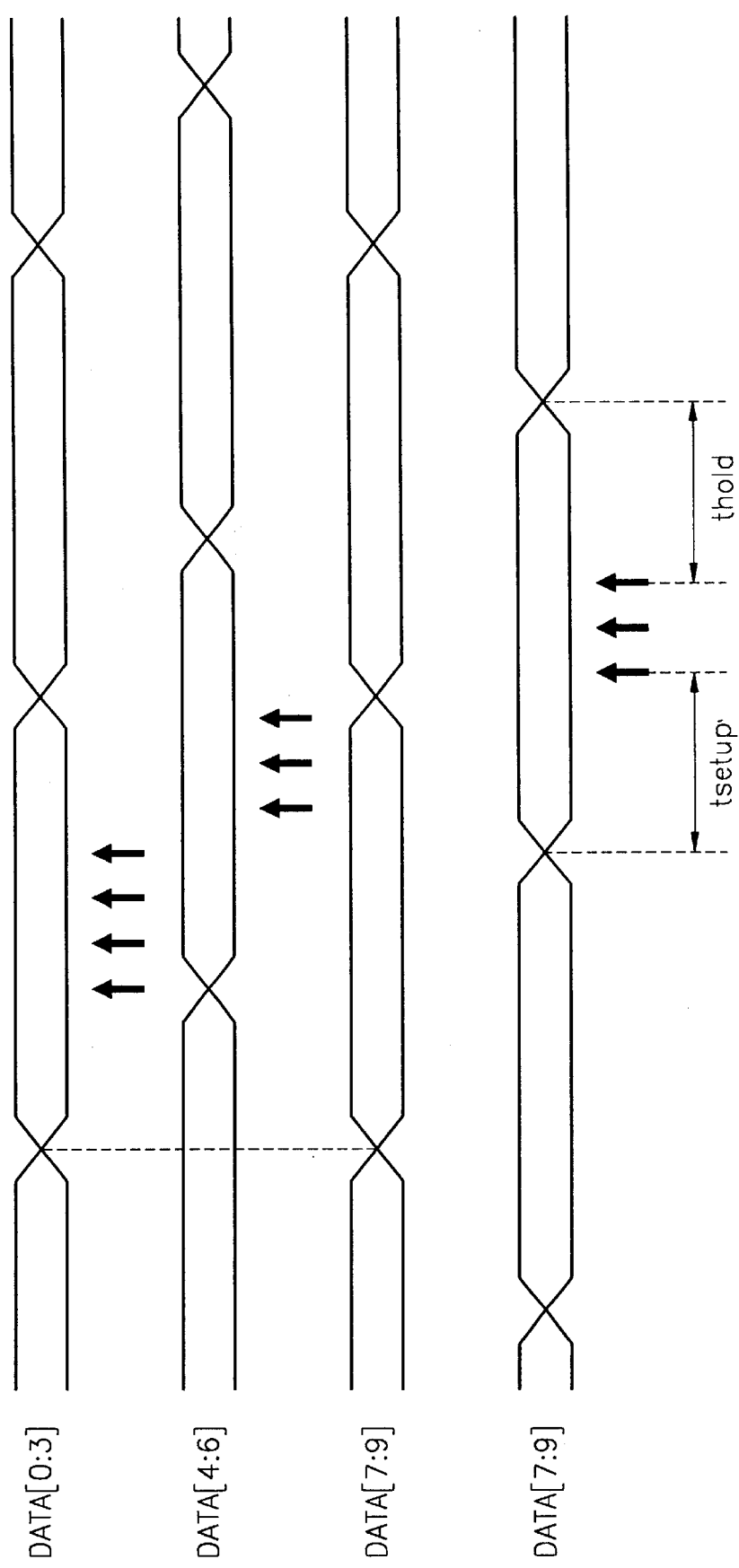
FIG. 5 illustrates a timing relationship of the data output from the converter of FIG. 3.

According to the parallel to serial converter as configured in FIG. 3, extra setup and hold times can be provided depending on the timing of clocking the series of registers 210 to 240. FIG. 5 shows a timing diagram of the data output at the outputs of series of registers 210 to 240. As shown in FIG. 5, when CLOCK 1 transitions from low to high, DATA (0,3) are latched into registers 210, which output the data to corresponding three input AND gates 250, 251, 252, and 253. When CLOCK 2 transitions from low to high, at a time after the transition from low to high of CLOCK 1, DATA (4,6) are clocked into registers 220 to output to three input AND gates 254 to 256 . When CLOCK 3 transitions from low to high, DATA (7,9) is latched into registers 230 to output to registers 240, which is clocked by transition from low to high of CLOCK 4, to output DATA (7,9) to corresponding three input AND gates 257 to 259. According to the present embodiment of the invention, CLOCK 3 is chosen to transition from low to high between the low to high transition of CLOCK 1 and CLOCK 2 and CLOCK 4 is chosen to transition to low to high after the low to high transition of CLOCK 1, CLOCK 2, and CLOCK 3. Preferably, CLOCK 4 transitions from low to high at around ⅔ T from the low to high transition of CLOCK 1. With the selection of low to high transition as shown for CLOCK 1 to CLOCK 4 in FIG. 5, extra hold time of nearly ⅓ T is provided before the next transition from low to high of CLOCK 1. Extra setup time of nearly ⅓ of T duration is provided to allow a new set of data to be clocked into any of registers 210, 220, and 230 without altering the serial data outputted through OR gate 260

Figure 6:
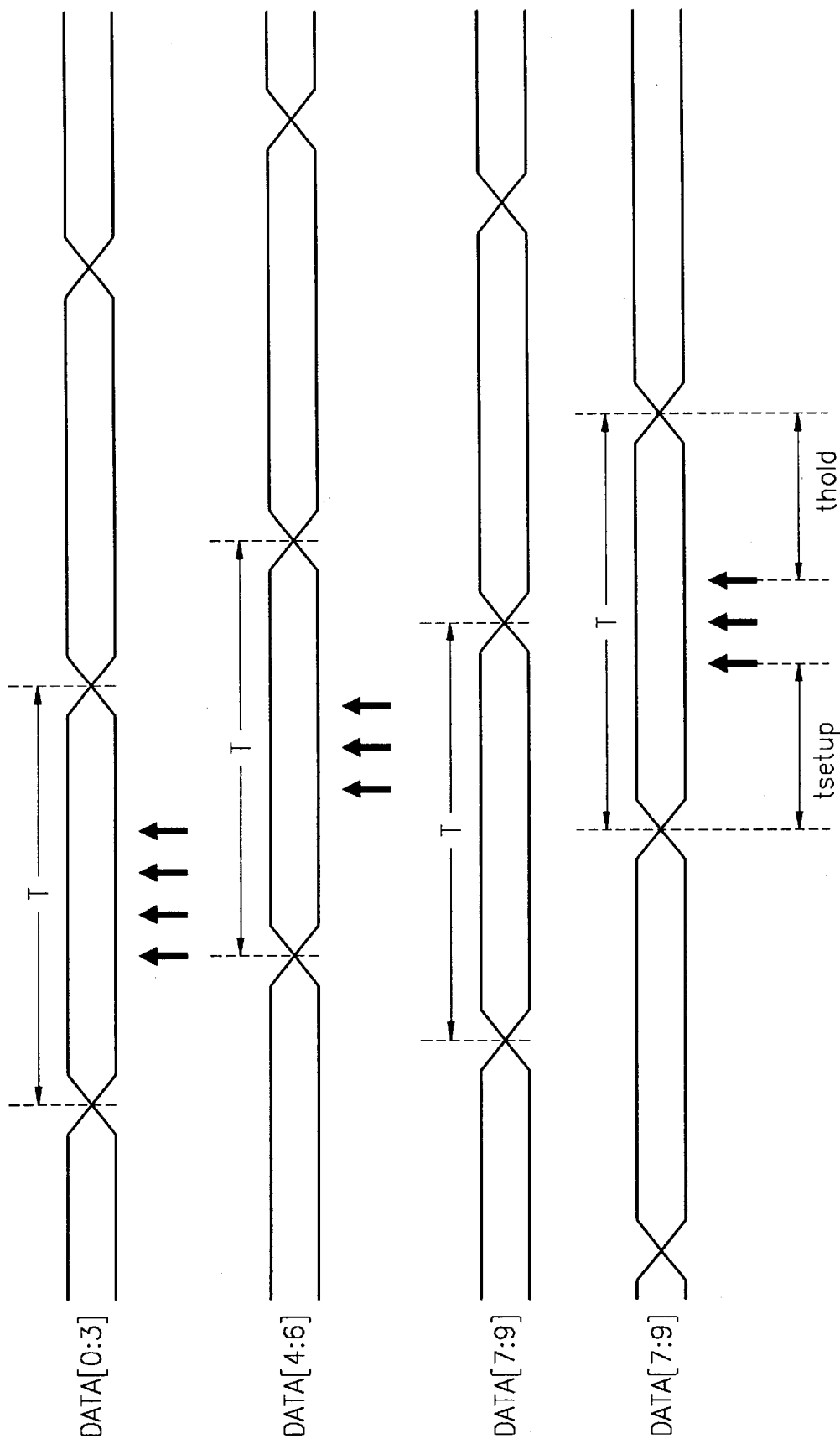
FIG. 6 shows the timing diagram of data output from the converter of FIG. 3 with modified clock timing according to another embodiment of the present invention.

FIG. 6 shows a timing diagram of an embodiment of the present invention wherein CLOCK 3 and CLOCK 1 are the same clock or at least have a low to high transition at the same time. With CLOCK 2 transitioning after CLOCK 1 and CLOCK 3, and CLOCK 4 transitioning after the transition of CLOCK 2, it can be seen that DATA (0,9) are provided to the three-input AND gates well before the transition from low to high of the second next CLOCK 1, providing extra setup time and hold time.

Advantageously, extra setup time and hold time are provided with the use of minimal amount of extra latches. According to the above described embodiment, three extra D flip flops are used.

One ordinarily skilled in the art can readily appreciate that further setup and hold times can be provided by modifying the configuration as shown in FIG. 3 to form other embodiments of the invention. For example, registers 240 can be two bits instead of three bits or it can be four bits instead of three bits. Alternatively, an additional register can be placed to receive the output of registers 220. The extra setup and hold times can be selectively provided by modifying the timing of the low to high transition of any or combination of CLOCK 1 TO CLOCK 4.

In the drawings and specification, there have been disclosed illustrative preferred embodiments of the invention and, although specific terms and number of bits of addressing and instruction are employed, they are used in a generic and descriptive sense only and not for purposes of limitation. Numerous modifications and variations of the present invention are possible in light of the above teachings. It is therefore to be understood that, within the scope of the appended claims, the present invention can be practiced in a manner other than as specifically described herein.

What is claimed is:

1. A circuit for serializing parallel data of N bits, comprising:
    a first register for storing M bits of the parallel data, M being less than N, the first register being clocked by a first clock;
    at least one second register other than the first register for storing at least N-M bits of the parallel data, the at least one second register being clocked by at least one second clock which is different in phase from the first clock;
    at least one third register for storing at least the nth and (n−1)th bits of parallel data output from the at least one second register, the third register being clocked by at least one third clock which is different in phase from the first and the second clocks; and
    logic gates for receiving as inputs the n bits of parallel data output from the first register and output from one or both of the at least one second register and the third register to form N serial data.

2. The circuit of claim 1, further including a plurality of n-phased clocks, each having a different phase from the other for coupling to the inputs of the logic gates.

3. The circuit of claim 2, wherein said logic gates include N gates corresponding to the N bits of data, wherein the nth bit data is input with the nth phased clock and ((N/2)+nth+1) phased clock to the nth logic gate.

4. The circuit of claim 2, wherein the duration of time between the first clock and the second clock is substantially one third the period of a clock frame in which each of the n-phased clocks have transitioned once.

5. The circuit of claim 2, wherein each of the n-phased clocks transition once within every repeated clock frame, and the first, second, and third clocks transition once within a register clock frame, and the nth bit data is output as serial data after the transition of the third clock in the register clock frame but before the end of the next register clock frame.

6. The circuit of claim 1, wherein said at least one second register comprises two registers and the at least one second clock comprises two clocks having transitions at different times.

7. The circuit of claim 1, wherein said at least one third register comprises two registers clocked by the at least one third clock which comprises two clocks having transitions at different times.

8. The circuit of claim 1, wherein the second and third clocks are 180 degrees out of phase.

9. A circuit for serializing parallel data of N bits, comprising:

a first register for storing M bits of the parallel data, M being less than N, the first register being clocked by a first clock;

a second register for storing P bits of the parallel data, the second register being clocked by a second clock which is different from the first clock;

a third register for storing Q bits of the parallel data, wherein M+P+Q=N, the third register being clocked by a third clock; and a fourth register for storing data output from the third register, the forth register being clocked by a forth clock which is different from the first, second, and third clocks; and logic gates for receiving as inputs the N bits of parallel data output from the first, second, and forth registers to form N serial data.

10. The circuit of claim 9, wherein the third clock is the same as the first clock.

11. The circuit of claim 9, further including a plurality of n-phased clocks, each having a different phase from the other for coupling to the inputs of the logic gates.

12. The circuit of claim 9, wherein said logic gates include n gates corresponding to the n bits of data, wherein the nth bit data is input with the nth phased and ((N/2)+nth+1) phased clocks to the nth logic gate.

13. The circuit of claim 9, wherein duration of time between transition of the first clock and transition of the second clock is substantially one third of the period of a clock frame.

14. The circuit of claim 9, wherein duration of time between transition of the second clock and transition of the forth clock is substantially one third of the period of a clock frame.

15. The circuit of claim 9, wherein each of the n-phased clocks transition once within every repeated clock frame, and the first, second, and third clocks transition once within a register clock frame, and the nth bit data is output as serial data after the transition of the third clock in the register clock frame but before the end of the next register clock frame.

16. The circuit of claim 9, wherein the third and the forth clocks are 180 degrees out of phase.

17. The circuit of claim 9, wherein the active transition of the third clock occurs between the active transition of the first and the second clocks.

18. A method for serializing parallel data of N bits, comprising the steps of:

storing M bits of the parallel data in a first register, M being less than N, the first register being clocked by a first clock;

storing P bits of the parallel data in a second register, the second register being clocked by a second clock which is different from the first clock;

storing Q bits of the parallel data in a third register, wherein M+P+Q=N, the third register being clocked by a third clock; and storing data output from the third register in a fourth register, the fourth register being clocked by a fourth clock which is different from the first, second, and third clocks; and receiving as inputs at logic gates the N bits of parallel data output from the first, second, and forth registers to form N serial data.

19. A method for serializing parallel data of N bits, comprising:

storing M bits of the parallel data in a first register, M being less than N, the first register being clocked by a first clock;

storing at least N-M bits of the parallel data in at least one second register other than the first register, the at least one register being clocked by at least one second clock which is different from the first clock;

storing at least the nth and (N−1)th bits of parallel data output from the at least one second register in at least one third register, the third register being clocked by at least one third clock which is different from the first and the second clocks; and receiving as inputs at logic gates the N bits of parallel data output from the first register and output from one or both of the at least one and the third registers to form N serial data.

* * * * *